(12) United States Patent
Chen et al.

(10) Patent No.: US 9,564,359 B2
(45) Date of Patent: Feb. 7, 2017

(54) CONDUCTIVE STRUCTURE AND METHOD OF FORMING THE SAME

(71) Applicant: Taiwan Semiconductor Manufacturing Company, Ltd., Hsin-Chu (TW)

(72) Inventors: Pin-Wen Chen, Keelung (TW); Chih-Wei Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/333,961

(22) Filed: Jul. 17, 2014

(65) Prior Publication Data

US 2016/0020142 A1   Jan. 21, 2016

(51) Int. Cl.
*H01L 21/02* (2006.01)
*H01L 21/4763* (2006.01)
*H01L 23/522* (2006.01)
*H01L 21/768* (2006.01)
*H01L 21/70* (2006.01)

(52) U.S. Cl.
CPC ... *H01L 21/76843* (2013.01); *H01L 21/76802* (2013.01); *H01L 21/76862* (2013.01); *H01L 21/76871* (2013.01); *H01L 21/76876* (2013.01); *H01L 21/76877* (2013.01); *H01L 21/76879* (2013.01)

(58) Field of Classification Search
CPC ............ H01L 21/76832; H01L 21/76834; H01L 21/76844; H01L 21/76846; H01L 21/76873
USPC .. 257/754, 774, E21.476, E23.011; 438/672, 625, 687
See application file for complete search history.

(56) References Cited

U.S. PATENT DOCUMENTS

| | | | |
|---|---|---|---|
| 5,470,792 A * | 11/1995 | Yamada | H01L 21/76879 257/E21.584 |
| 6,260,256 B1 * | 7/2001 | Sasaki | G11B 5/313 29/603.01 |
| 2002/0155699 A1 * | 10/2002 | Ueda | H01L 21/31116 438/637 |
| 2005/0085070 A1 | 4/2005 | Park | |
| 2008/0045010 A1 * | 2/2008 | Wongsenakhum | H01L 21/28556 438/656 |
| 2009/0026618 A1 * | 1/2009 | Kim | H01L 21/76843 257/751 |

(Continued)

FOREIGN PATENT DOCUMENTS

| | | |
|---|---|---|
| KR | 20050052105 | 6/2005 |
| KR | 100599434 | 7/2006 |

(Continued)

*Primary Examiner* — Kimberly Rizkallah
*Assistant Examiner* — Brian Turner
(74) *Attorney, Agent, or Firm* — Slater Matsil, LLP

(57) ABSTRACT

Conductive structures and method of manufacture thereof are disclosed. In some embodiments, a method of forming a conductive structure includes providing a substrate having a recess formed therein, the recess lined with a first seed layer and partially filled with a first conductive material; removing a portion of the first seed layer free from the first conductive material to form an exposed surface of the recess; lining the exposed surface of the recess with a second seed layer; and filling the recess with a second conductive material, the second conductive material covering the first conductive material and the second seed layer.

20 Claims, 13 Drawing Sheets

(56) References Cited

U.S. PATENT DOCUMENTS

| | | |
|---|---|---|
| 2012/0032334 A1 | 2/2012 | Lee et al. |
| 2013/0171822 A1 | 7/2013 | Chandrashekar et al. |
| 2013/0228880 A1* | 9/2013 | Vogt .................... H01L 27/0248 |
| | | 257/414 |

FOREIGN PATENT DOCUMENTS

| | | |
|---|---|---|
| KR | 100753416 B1 | 8/2007 |
| KR | 20120096413 | 8/2012 |

\* cited by examiner

200

202 — Providing a substrate having a first recess and a second recess formed therein, wherein the first recess extends into the substrate by a first distance and the second recess extends into the substrate by a second distance smaller than the first distance 204 — Lining the first recess and the second recess with a first seed layer 206 — Exposing the first seed layer in the second recess and a portion of the first seed layer in the first recess proximate an opening of the first recess to a treatment plasma to form treated portions of the first seed layer 208 — Partially filling the first recess with a first conductive material, wherein the treated portions of the first seed layer are free from the first conductive material Continued on drawing sheet 3 of 13

Continuation of drawing sheet 2 of 13

Removing the treated portions of the first seed layer to form exposed surfaces of the first recess and the second recess —210

Lining the exposed surfaces of the first recess and the second recess with a second seed layer —212

Covering the second seed layer with a second conductive material, the second conductive material filling the first recess and the second recess —214

Fig. 2 (Continued)

CONDUCTIVE STRUCTURE AND METHOD OF FORMING THE SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. Concurrently, conductive structures, such as, for example, contact plugs, that provide an electrical connection to and/or from the various electronic components have also experienced continual reductions in critical dimensions and minimum feature size. However, these reductions in critical dimensions and minimum feature size are often accompanied by an increase in contact resistance of the conductive structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 and FIG. 2 show methods of forming conductive structures, in accordance with some embodiments.

DETAILED DESCRIPTION

Figure 1:
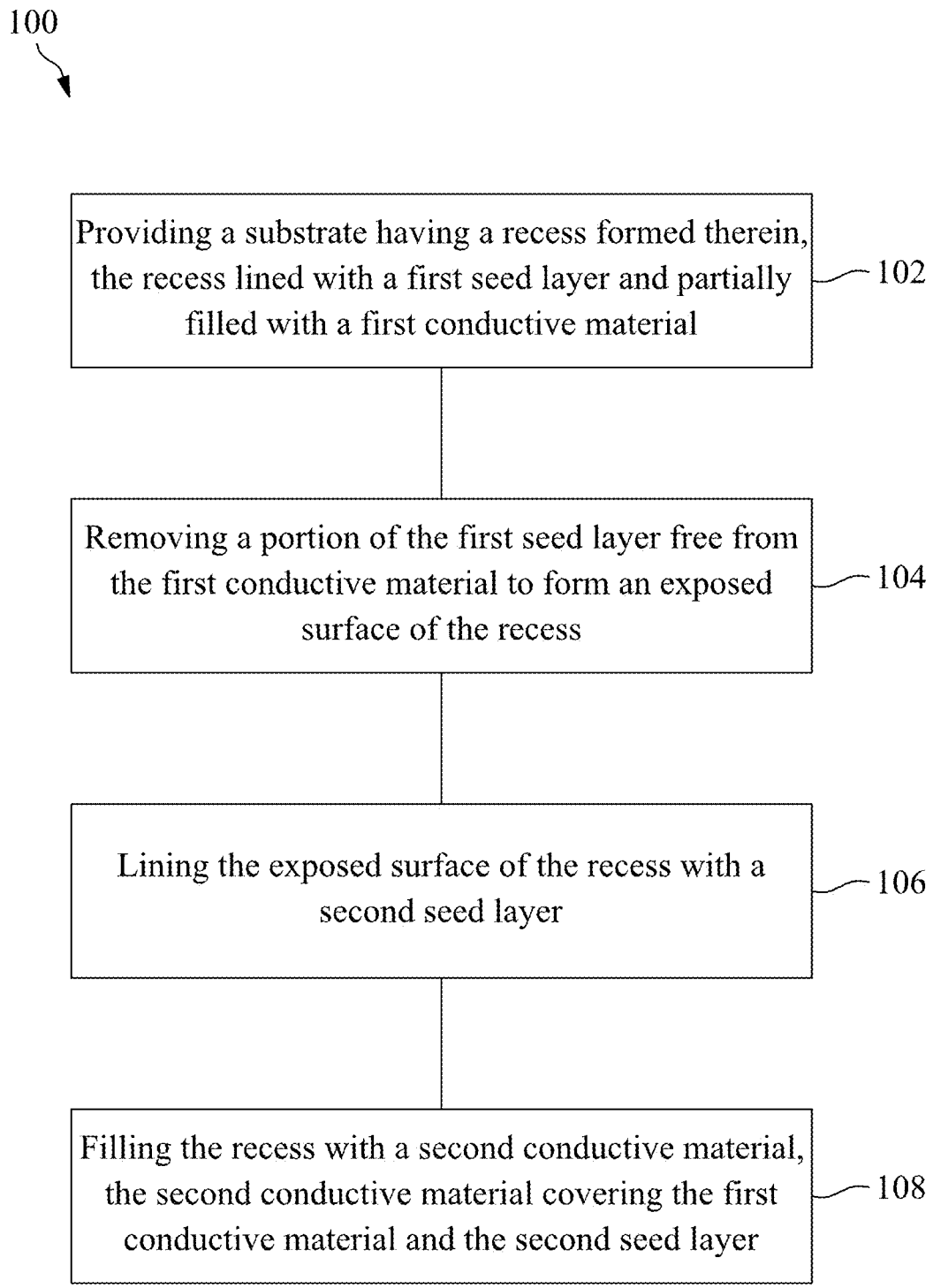

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a method 100 of forming a conductive structure (e.g. a contact plug), in accordance with one or more embodiments. The method 100 may include: providing a substrate having a recess formed therein, the recess lined with a first seed layer and partially filled with a first conductive material (in 102); removing a portion of the first seed layer free from the first conductive material to form an exposed surface of the recess (in 104); lining the exposed surface of the recess with a second seed layer (in 106); and filling the recess with a second conductive material, the second conductive material covering the first conductive material and the second seed layer (in 108).

FIG. 2 shows a method 200 of forming a conductive structure (e.g. a contact plug), in accordance with one or more embodiments. The method 200 may include: providing a substrate having a first recess and a second recess formed therein, wherein the first recess extends into the substrate by a first distance and the second recess extends into the substrate by a second distance smaller than the first distance (in 202); lining the first recess and the second recess with a first seed layer (in 204); exposing the first seed layer in the second recess and a portion of the first seed layer in the first recess proximate an opening of the first recess to a treatment plasma to form treated portions of the first seed layer (in 206); partially filling the first recess with a first conductive material, wherein the treated portions of the first seed layer are free from the first conductive material (in 208); removing the treated portions of the first seed layer to form exposed surfaces of the first recess and the second recess (in 210); lining the exposed surfaces of the first recess and the second recess with a second seed layer (in 212); and covering the second seed layer with a second conductive material, the second conductive material filling the first recess and the second recess (in 214).

FIG. 3A to FIG. 3H show a process flow illustrating some of the process steps of the method 100 shown in FIG. 1 and the method 200 shown in FIG. 2, in accordance with one or more embodiments. The process flow illustrated in FIG. 3A to FIG. 3H may, for example, be carried out during manufacture of a conductive structure for contacting (e.g. electrically contacting) an underlying electrical element (e.g. via, conductive line or trace, etc.) and/or an underlying electronic component (e.g., transistor, diode, resistor, capacitor, etc.).

Figure 3A:
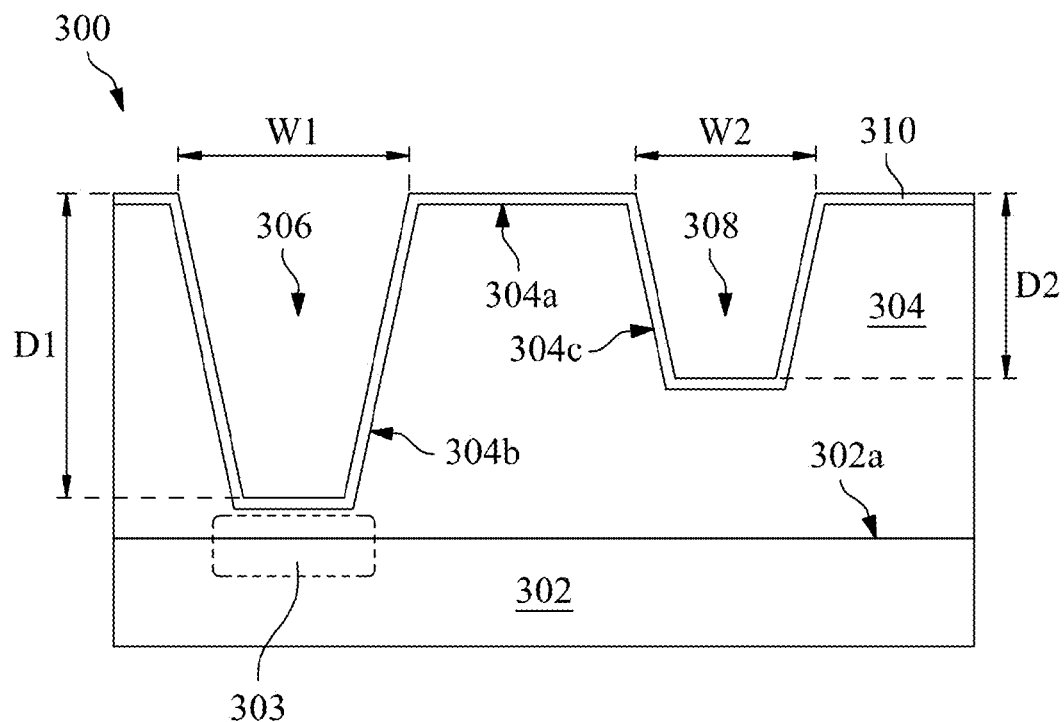
FIG. 3A to FIG. 3H show a process flow illustrating some of the process steps of the methods shown in FIG. 1 and FIG. 2, in accordance with some embodiments.

FIG. 3A shows a substrate 300 including a semiconductor substrate layer 302, an insulating layer 304, a first recess 306, a second recess 308, and a barrier layer 310. The semiconductor substrate layer 302 may include, or may consist of, an elementary semiconductor material (such as silicon or germanium); a compound semiconductor material (including silicon carbide, gallium arsenic, gallium phosphide, indium phosphide, indium arsenide, and/or indium antimonide); an alloy semiconductor material (including SiGe, GaAsP, AlInAs, AlGaAs, GaInAs, GaInP, and/or GaInAsP); or combinations thereof. The semiconductor substrate layer 302 may include, or may be, a semiconductor on insulator (SOI) substrate. The SOI substrate may include a buried oxide (BOX) layer formed by a process such as separation by implanted oxygen (SIMOX), and/or other suitable processes. Further, the semiconductor substrate layer 302 may include an epitaxial layer (epi-layer) that may, for example, be strained for performance enhancement.

The semiconductor substrate layer 302 may include an electrical element and/or an electronic component (shown in phantom in FIG. 3A as reference number 303) formed therein or thereon. For example, the electrical element and/or electronic component 303 may be formed at or near a surface 302a of the semiconductor substrate layer 302 facing the insulating layer 304. The electrical element may include, or may be, at least one of a via, a conductive line, a conductive trace, or the like, while the electronic component may include, or may be, at least one of a transistor, a diode, a resistor, a capacitor, or the like.

The insulating layer 304 may be disposed atop the surface 302a of the semiconductor substrate layer 302. The insulating layer 304 may include, or may consist of, a dielectric material and may be an interlayer dielectric (ILD) layer. The dielectric material of the insulating layer 304 may include, or may be, a low-k dielectric material, for example, with a k value less than or equal to about 3.0, or even less than or equal to about 2.5. The insulating layer 304 may include, or may consist of, phosphosilicate glass (PSG), borophosphosilicate glass (BPSG), fluorosilicate glass (FSG), $SiO_xC_y$, tetraethyl orthosilicate (TEOS) oxide, spin-on-glass, spin-on-polymers, silicon carbon material, compounds thereof, composites thereof, combinations thereof, or the like. The insulating layer 304 may include one or more layers of insulating material. In other words, the insulating layer 304 may include, or may be, a single layer structure (e.g. including one layer of insulating material) or a multilayer structure (e.g. including two or more layers of insulating material). The insulating layer 304 may include one or more electrical elements (e.g. a via, a conductive line, a conductive trace, or the like) formed therein (not shown in FIG. 3A). The insulating layer 304 may be formed atop the semiconductor substrate layer 302 by chemical vapor deposition (CVD), physical vapor deposition (PVD), atomic layer deposition (ALD), a spin-on-dielectric process, combinations thereof, or the like.

After forming the insulating layer 304 atop the semiconductor substrate layer 302, a first trench 304b and a second trench 304c (which may be shallower than the first trench 304b) may be formed in the insulating layer 304, e.g. by an etch process. The etch process may include, or may be, at least one of a wet etch process or a dry etch process (e.g. a plasma etch process). In forming the first trench 304b and the second trench 304c, a patterned etch mask (not illustrated in FIG. 3A) may first be formed over a portion of a surface 304a of the insulating layer 304 facing away from the semiconductor substrate layer 302. The patterned etch mask may be formed by coating a masking material (e.g. a photoresist) over the surface 304a of the insulating layer 304, and patterning the masking material to form the patterned etch mask. Patterning the masking material may include, or may consist of, a lithographic process (e.g. a photo-lithographic process). Thereafter, the etch process may be applied in cooperation with the patterned etch mask to form the first trench 304b and the second trench 304c in the insulating layer 304. The surface 304a of the insulating layer 304 and surfaces of the newly formed first trench 304b and second trench 304c may be cleaned after the etch process. As an example, at least one of an inert gas sputtering process (e.g. argon sputter) or a plasma based cleaning process (e.g. a SiCoNi pre-clean process) may be used to clean the surfaces of the first trench 304b, the second trench 304c, and the insulating layer 304.

The barrier layer 310 may thereafter be formed over the cleaned surfaces of the first trench 304b and the second trench 304c as well as over the cleaned surface 304a of the insulating layer 304. The surfaces of the barrier layer 310 in the first trench 304b may define the surfaces of the first recess 306. Similarly, the surfaces of the barrier layer 310 in the second trench 304c may define the surfaces of the second recess 308. The barrier layer 310 may prevent conductive material subsequently formed in the first recess 306 and the second recess 308 from diffusing into the insulating layer 304.

The barrier layer 310 may be formed by at least one of PVD, CVD, ALD, or the like. Forming the barrier layer 310 may also include a thermal process (e.g. an annealing process), which may, as an example, be performed at a temperature in a range from about 400 degrees Celsius to about 650 degrees Celsius, e.g. in a range from about 450 degrees Celsius to about 600 degrees Celsius, although other temperature ranges may be possible as well.

The barrier layer 310 may have a thickness in the range from about 1 nanometer to about 20 nanometers, for example in the range from about 3 nanometers to about 15 nanometers, although other thickness may be possible as well. The barrier layer 310 may include, or may consist of, tantalum nitride (TaN), tantalum (Ta), ruthenium (Ru), combinations thereof, or the like. While these are the commonly considered materials, other barrier layer materials can also be used such as titanium (Ti), tungsten (W), zirconium (Zr), hafnium (Hf), molybdenum (Mo), niobium (Nb), vanadium (V), ruthenium (Ru), iridium (Ir), platinum (Pt), and chromium (Cr), as examples.

The barrier layer 310 may include one or more layers of barrier material. In other words, the barrier layer 310 may include, or may be, a single layer structure (e.g. including one layer of barrier material) or a multilayer structure (e.g. including two or more layers of barrier material). As an example, the barrier layer 310 may include a first layer (e.g. including Ti and having a thickness of, e.g., about 2 nanometers) proximate the insulating layer 304 and a second layer (e.g. including TiN and having a thickness of, e.g., about 2 nanometers) formed over the first layer.

A first width W1 of the first recess 306 may be measured as the widest lateral extent of the first recess 306. Similarly, a second width W2 of the second recess 308 may be measured as the widest lateral extent of the second recess 308. As an example, the first width W1 may be measured as the distance between opposing surfaces of the barrier layer 310 at an opening of the first recess 306, as shown in the example of FIG. 3A. A similar way of measuring the second width W2 is illustrated in the example of FIG. 3A. The first width W1 and the second width W2 may each be in a range from about 10 nanometers to about 100 nanometers, for example in a range from about 20 nanometers to about 50 nanometers, for example about 25 nanometers, although other values may be possible as well in accordance with other embodiments.

The first recess 306 may extend into the substrate 300 by a first distance D1 and the second recess 308 may extend into the substrate 300 by a second distance D2, which may be smaller than the first distance D1. The first distance D1 and the second distance D2 may, as an example, be referred to as a depth of the first recess 306 and a depth of the second recess 308, respectively. As shown in FIG. 3A, the first distance D1 may, for example, be measured as a distance (e.g. perpendicular distance) between a surface of the barrier layer 310 outside the first recess 306 and a surface of the barrier layer 310 at a floor of the first recess 306. A similar way of measuring the second distance D2 is illustrated in the example of FIG. 3A.

In the example shown in FIG. 3A, the first recess 306 extends fully through the insulating layer 304 of the substrate 300, while the second recess 308 extends partially through the insulating layer 304 of the substrate 300. However, in another embodiment, both the first recess 306 and the second recess 308 may extend partially through the insulating layer 304. The first distance D1 may be in the range from about 50 nanometers to about 300 nanometers, for example in the range from about 100 nanometers to about 200 nanometers, for example about 150 nanometers, although other values may be possible as well in accordance with other embodiments. The second distance D2 may be in the range from about 50 nanometers to about 100 nanometers, for example about 80 nanometers, although other values may be possible as well in accordance with other embodiments.

A conductive structure, e.g. a contact plug, may subsequently be formed in the first recess 306 and the second recess 308, e.g. to contact underlying electrical elements (e.g. vias, conductive lines or traces, etc.) and/or underlying electronic components (e.g., transistors, diodes, resistors, capacitors, etc.). FIG. 3B to FIG. 3H illustrates some of the process steps of forming a conductive structure in the first recess 306 and the second recess 308 shown in FIG. 3A.

Figure 3B:
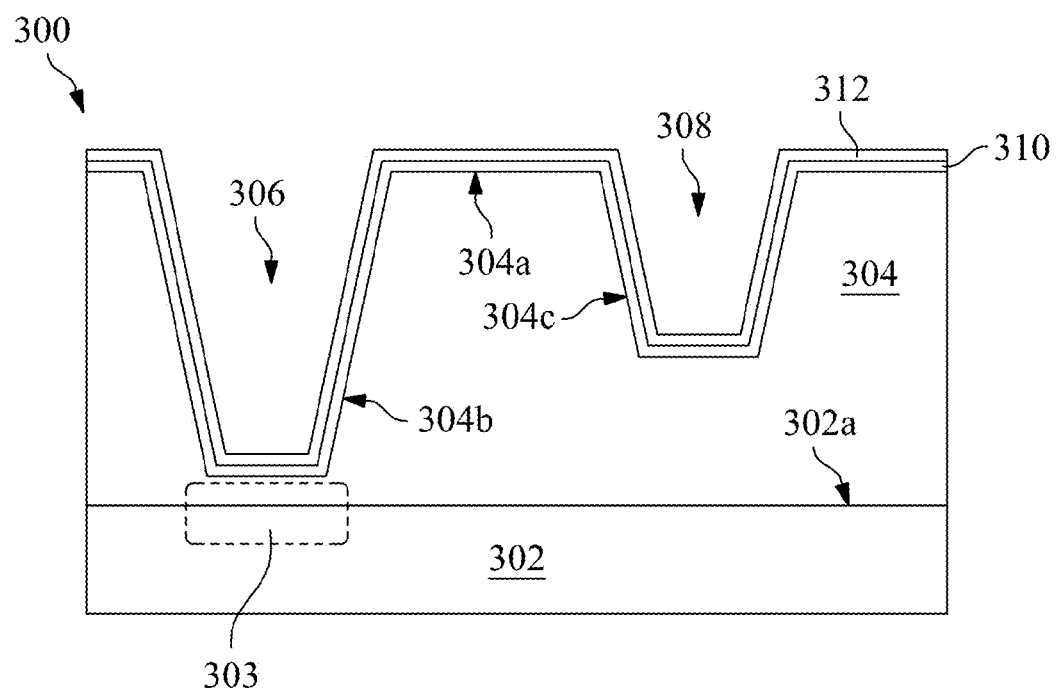

As shown in FIG. 3B, a first seed layer 312 may be formed in the first recess 306 and the second recess 308, lining the surfaces thereof. The first seed layer 312 is also formed over the barrier layer 310 disposed atop the surface 304a of the insulating layer 304. The first seed layer 312 is a thin layer of conductive material that aids in the formation of a thicker layer during subsequent processing steps (e.g. in the formation of a first conductive material in the first recess 306, as shown in FIG. 3D). The first seed layer 312 may be formed by at least one of a pulsed nucleation layer (PNL) process or an ALD process, although other processes may be possible as well. The process for forming the first seed layer 312 may be performed at a temperature in a range from about 200 degrees Celsius to about 500 degrees Celsius, e.g. about 400 degrees Celsius. In an embodiment, the first seed layer 312 may include, or may consist of, tungsten. In other embodiments, other conductive materials may be possible, e.g. copper, titanium, tantalum, chromium, platinum, silver, gold, combinations thereof, or the like. The first seed layer 312 may have a thickness in a range from about 1 nanometer to about 5 nanometers (e.g. about 3 nanometers), although other thicknesses may be possible as well.

Figure 3C:
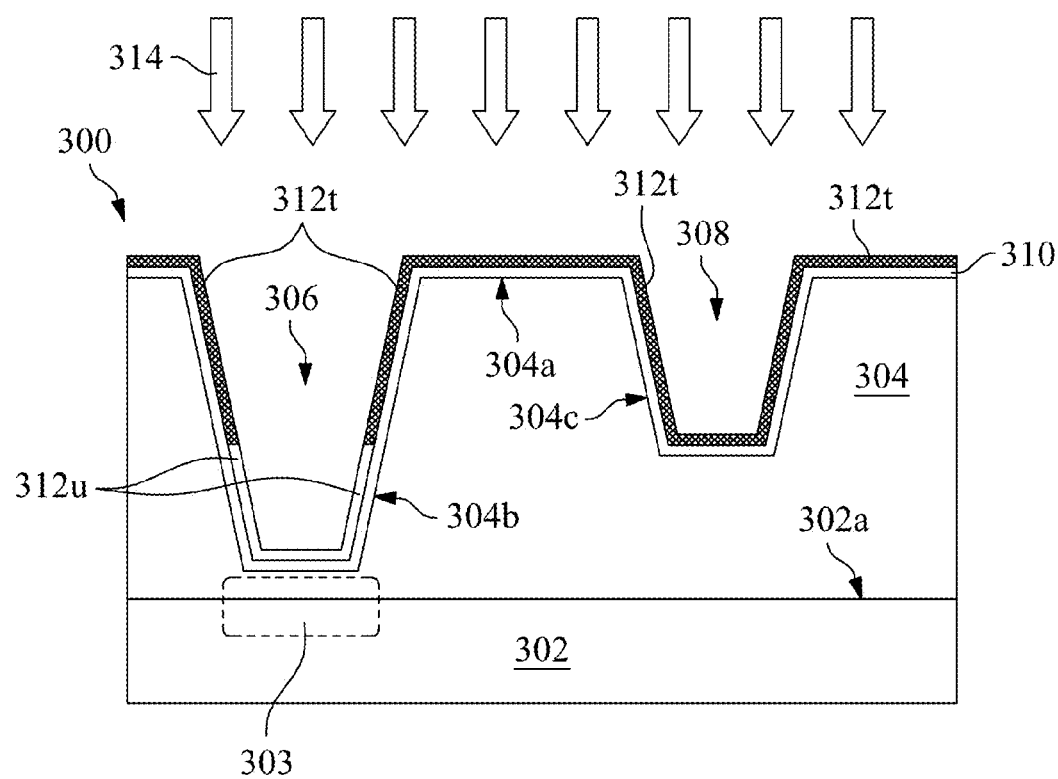
Figure 3D:
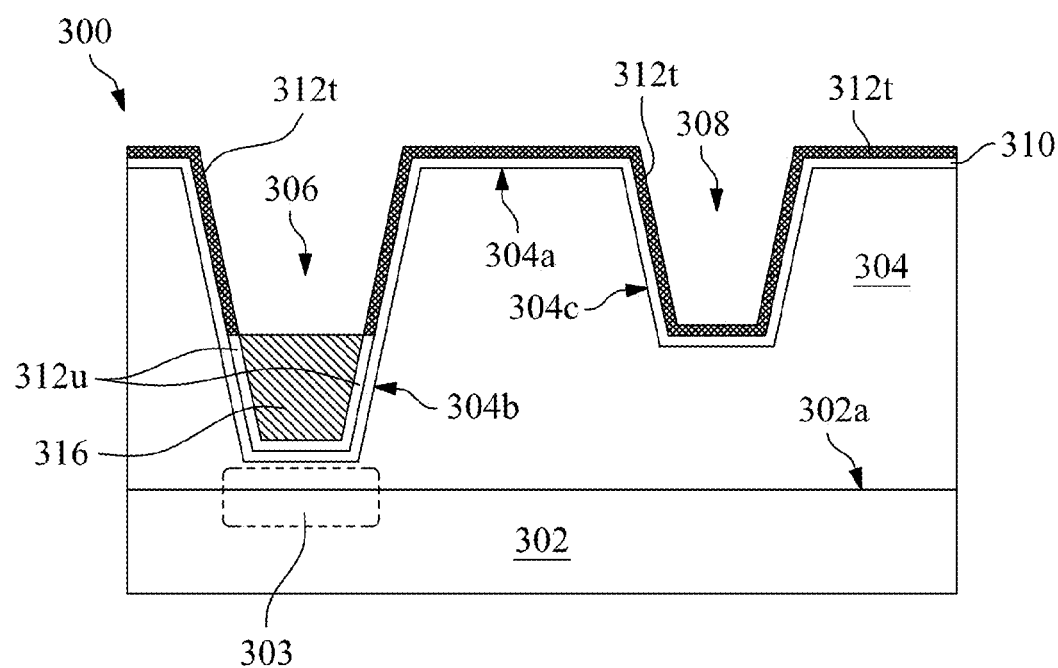

Thereafter, portions of the first seed layer 312 may be exposed to a treatment process 314 to form treated portions of the first seed layer 312t, as shown in FIG. 3C. Portions of the first seed layer 312 not exposed to the treatment process 314 may be referred to as untreated portions of the first seed layer 312u. Treated portions of the first seed layer 312t may include portions of the first seed layer 312 within the second recess 308, portions of the first seed layer 312 disposed over the surface 304a of the insulating layer 304, and a portion of the first seed layer 312 within the first recess 306 proximate the opening of the first recess 306, as shown in the example of FIG. 3C.

The portions of the first seed layer 312 exposed to the treatment process 314 may depend at least in part on the geometry of the first recess 306 and the second recess 308. For example, the second recess 308 shown in FIG. 3C is shallower than the first recess 306. Accordingly, the treatment process 314 may be able to penetrate the entire second distance D2 of the second recess 308, thus treating all portions of the first seed layer 312 dispose in the second recess 308. On the other hand, the first recess 306 may extend deeper into the substrate 300. Accordingly, the treatment process 314 may penetrate only a portion (e.g. an upper portion) of the first recess 306, thus treating the portion of the first seed layer 312 within the first recess 306 proximate the opening of the first recess 306.

The treatment process 314 may inhibit or suppress growth, deposition, or nucleation of conductive material at the treated portions of the first seed layer 312t. This inhibition or suppression may be achieved by various mechanisms. In one mechanism, an activated species may passivate exposed portions of the first seed layer 312. For example, the activated species may be a treatment plasma. Stated in another way, the treatment process 314 may be a plasma treatment process. The treatment plasma may include, or may be, at least one of a nitrogen containing plasma, a hydrogen containing plasma, an oxygen containing plasma, or a hydrocarbon containing plasma. The degree to which the treatment process 314 inhibits growth, deposition, or nucleation of conductive material at the treated portions of the first seed layer 312t may depend, at least in part, on the composition of the treatment plasma. As an example, nitrogen may have a stronger inhibiting effect than hydrogen, and adjustment of the relative concentrations of nitrogen and hydrogen in the treatment plasma can vary the degree to which growth, deposition, or nucleation of conductive material is suppressed or inhibited at the treated portions of the first seed layer 312t. In an embodiment where the treatment plasma includes, or consists of, nitrogen (e.g. $N_2$), the treatment plasma may be flowed at a rate in a range from about 1 standard cubic centimeters per minute (sccm) to about 20 sccm. In this embodiment, the treatment process 314 may performed at a temperature in a range from about 300 degrees Celsius to about 400 degrees Celsius and at a pressure ranging from about 0.6 Torrs to about 2 Torrs, although other temperatures and pressures may be possible as well. In another mechanism, inhibition may be achieved by a chemical reaction between an activated species and the exposed surfaces of the first seed layer 312. The chemical reaction may form a thin layer of a compound material (e.g. tungsten nitride or tungsten carbide). The activated species may be formed by plasma generation and/or exposure to ultraviolet (UV) radiation, as examples, and may include atomic species, radical species, and ionic species. In yet another mechanism, inhibition may be achieved by a surface effect such as adsorption that passivates the surface without forming a layer of a compound material.

The treatment process 314 also may have an effect of changing a phase of the material or materials in the treated portions of the first seed layer 312t. As an example, the first seed layer 312 shown in FIG. 3B may include, or may consist of, tungsten at a first phase known as alpha tungsten. After the treatment process 314 shown in FIG. 3C, the phase of the tungsten in the treated portions of the first seed layer 312t may be changed from the first phase (alpha tungsten) to a second phase known as beta tungsten. The phase of the tungsten in the untreated portions of the first seed layer 312u is unchanged and remains as alpha tungsten. The change in the phase of the tungsten at the treated portions of the first seed layer 312t may also result in a change in a resistivity of the tungsten. For example, alpha tungsten (in the untreated portions of the first seed layer 312u) has a resistivity in a range from about 5 micro-ohm centimeters to about 6 micro-ohm centimeters at about 300 Kelvin, while beta tungsten (in the treated portions of the first seed layer 312t) has a resistivity greater than about 40 micro-ohm centimeters at about 300 Kelvin. A conductive material that is subsequently formed in the substrate 300 may be preferentially or selectively formed over the untreated portions of the first seed layer 312u and not over the treated portions of the first seed layer 312t.

As shown in FIG. 3D, the first recess 306 may be partially filled with a first conductive material 316, which may include, or may consist of, similar materials as the first seed layer 312. The first conductive material 316 may cover the untreated portions of the first seed layer 312u. Since growth, deposition, or nucleation of conductive material is suppressed or inhibited at the treated portions of the first seed layer 312t, the first conductive material 316 is not formed over the treated portions of the first seed layer 312t. Accordingly, the treated portions of the first seed layer 312t may be free from the first conductive material 316. The first conductive material 316 may also be referred to as first bulk conductive material, which may have a lower resistivity than the treated portions of the first seed layer 312t.

The first conductive material 316 may be formed within the first recess 306 by a fill process. In an embodiment, the fill process may be at least one of a PVD process or a CVD process. The fill process may be a bottom-up fill process, which may be a consequence of the treatment process 314. For example, besides inhibiting formation of conductive material at the treated portions of the first seed layer 312t, the treatment process 314 (shown in FIG. 3C) may cause conductive material formed over the untreated portions of the first seed layer 312u to proceed as a bottom-up fill process as opposed to a conformal fill process. As applied to the example shown in FIG. 3D, in the bottom-up fill process, the first conductive material 316 may be initially formed at the floor of the first recess 306 as a thin layer which increases in thickness towards the opening of the first recess 306 until the untreated portions of the first seed layer 312u are covered by the first conductive material 316. This bottom-up fill process prevents gaps, voids, or seam holes from forming within the first conductive material 316, which are features often associated with a conformal fill process. The fill process may performed at a temperature in a range from about 300 degrees Celsius to about 450 degrees Celsius and at a pressure ranging from about 100 Torrs to about 500 Torrs (e.g. about 300 Torrs), although other temperatures and pressures may be possible as well.

As described above, even though the treated portions of the first seed layer 312t and the untreated portions of the first seed layer 312u may include, or may consist of, similar materials, a phase of the materials therein may be different. In the event that conductive material (e.g. a second seed layer) is formed over the treated portions of the first seed layer 312t, the treated portions of the first seed layer 312t may induce a change in a phase of the material of the conductive material (e.g. second seed layer). Specifically, the phase of the material of the conductive material may be changed from its original low resistivity phase to the high resistivity phase of the material in the treated portions of the first seed layer 312t. Therefore, retaining the treated portions of the first seed layer 312t can adversely affect a contact resistance of conductive structures formed in the substrate 300.

Figure 3E:
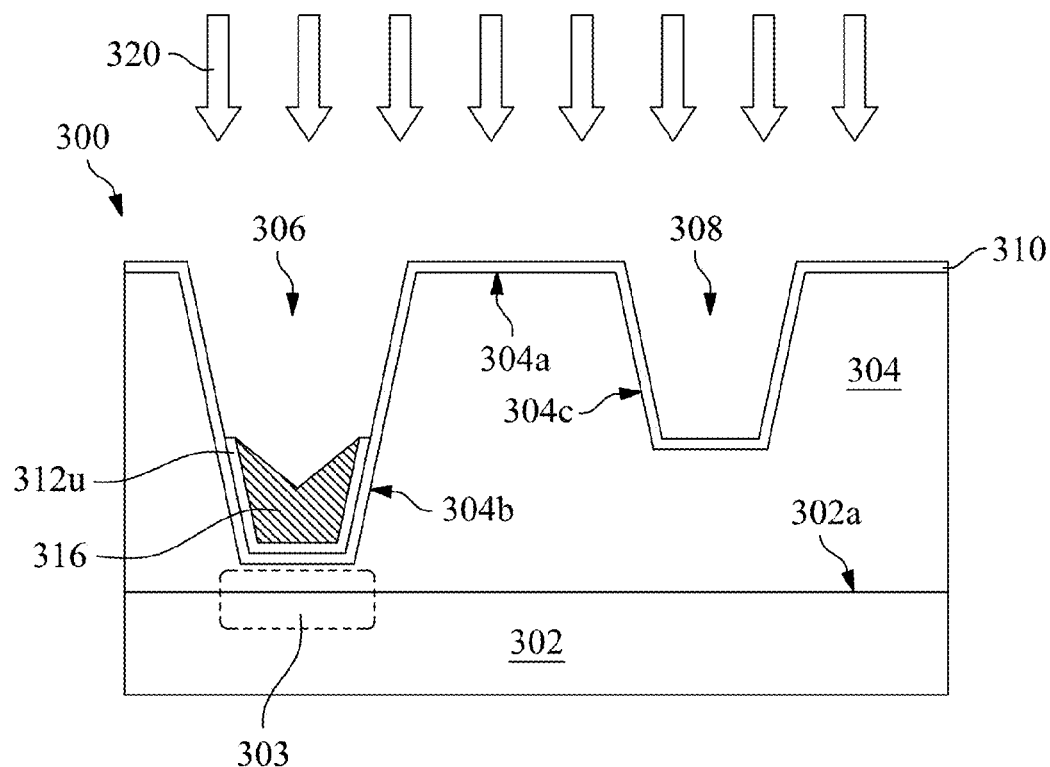

Consequently, as shown in FIG. 3E, the treated portions of the first seed layer 312t may be removed (e.g. by an etch process 320) to expose surfaces of the first recess 306 and the second recess 308 (e.g. to expose surfaces of the barrier layer 310, which define the surfaces of the first recess 306 and the second recess 308). In addition, a surface of the first conductive material 316 facing the opening of the first recess 306 may be etched by the etch process 320, thereby removing a portion of the first conductive material 316 proximate the opening of the first recess 306.

In an embodiment, the etch process 320 may be a dry etch process (e.g. a plasma etch process). An etchant used in the etch process 320 may include, or may consist of, a halogen containing etchant. The composition of the etchant may depend, at least in part, on the material or materials of the treated portions of the first seed layer 312t. For example, in an embodiment where the treated portions of the first seed layer 312t include, or consist of, tungsten (e.g. beta tungsten), the etchant used in the etch process 320 may be a fluorine containing etchant, e.g. a fluorine containing plasma (e.g. $NF_3$ plasma). The etchant used in the etch process 320 may be flowed at a rate in a range from about 50 sccm to about 200 sccm, although other flow rates may be possible as well. As a result of the etch process 320 shown in FIG. 3E, portions of the substrate 300 having high resistivity are removed.

Figure 3F:
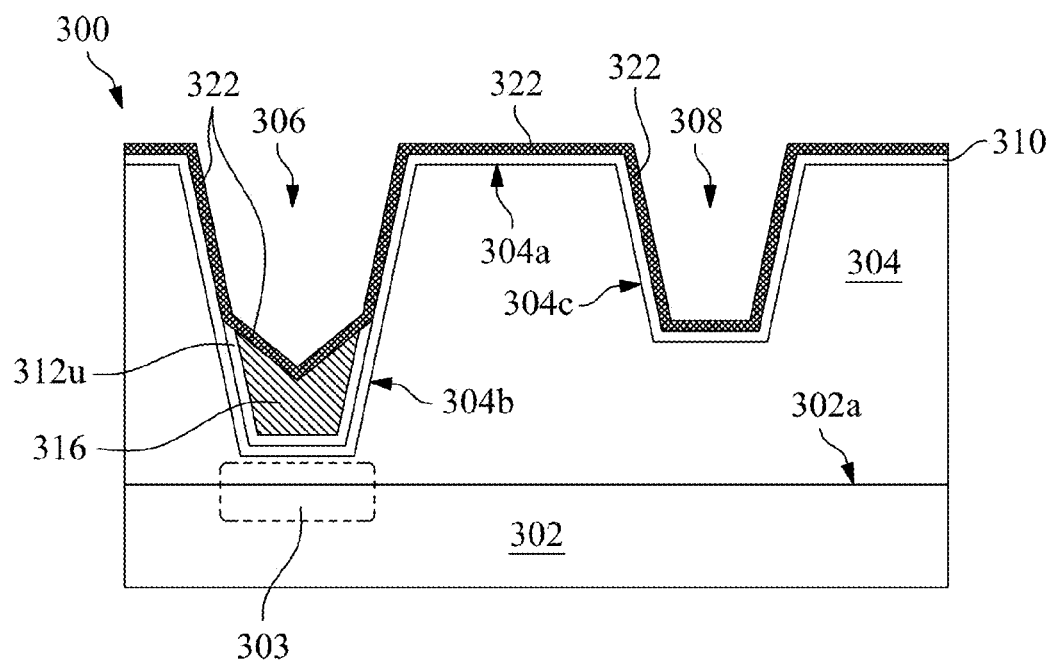
Figure 3G:
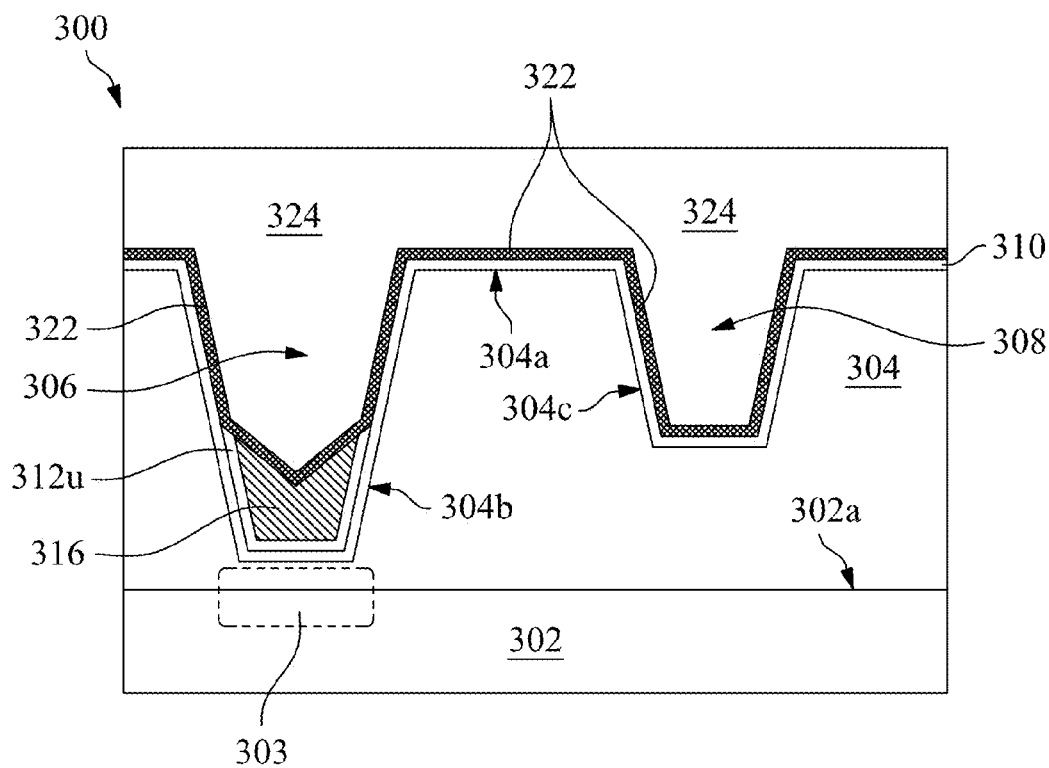

As shown in FIG. 3F, a second seed layer 322 may be formed in the first recess 306 and the second recess 308, lining the exposed surfaces thereof. The second seed layer 322 is also formed atop the barrier layer 310 disposed over the surface 304a of the insulating layer 304 and over the surface of the first conductive material 316 facing the opening of the first recess 306. Similar to the first seed layer 312, the second seed layer 322 is a thin layer of conductive material that aids in the formation of a thicker layer during subsequent processing steps (e.g. in the formation of a second conductive material in the first recess 306 and the second recess 308, as shown in FIG. 3G). The second seed layer 322 may include, or may consist of, similar materials as the first seed layer 312, and the materials of the second seed layer 322 may be at a low resistivity phase (e.g. alpha tungsten). The second seed layer 322 may have a thickness in a range from about 1 nanometer to about 8 nanometers (e.g. about 5 nanometers). The second seed layer 322 may be formed by similar processes as the first seed layer 312, although the process for forming the second seed layer 322 may be performed at a temperature greater than or equal to about 200 degrees Celsius, e.g. in a range from about 300 degrees Celsius to about 400 degrees Celsius and at a pressure in the range from about 2 Torrs to about 10 Torrs (e.g. about 5 Torrs).

As shown in FIG. 3G, the first recess 306 and the second recess 308 having the second seed layer 322 formed therein are overfilled will a second conductive material 324. In the example shown in FIG. 3G, the second conductive material 324 covers the first conductive material 316 and the second seed layer 322 within the first recess 306 and the second recess 308. In addition, the second conductive material 324 covers the second seed layer 322 disposed over the surface 304a of the insulating layer 304. The second conductive material 324 may be formed by a bottom-up fill process or a conformal process. In the example where formation of the second conductive material 324 is a conformal process, gaps, voids, or seam hole are prevented from forming by virtue of the shallower depth in the first recess 306 and the second recess 308 that needs to be filled with the second conductive material 324. The second conductive material 324 may include, or may consist of, similar materials as the first conductive material 316. The second conductive material 324 may also be referred to as second bulk conductive material, which may have a lower resistivity than the treated portions of the previously removed first seed layer 312t.

Figure 3H:
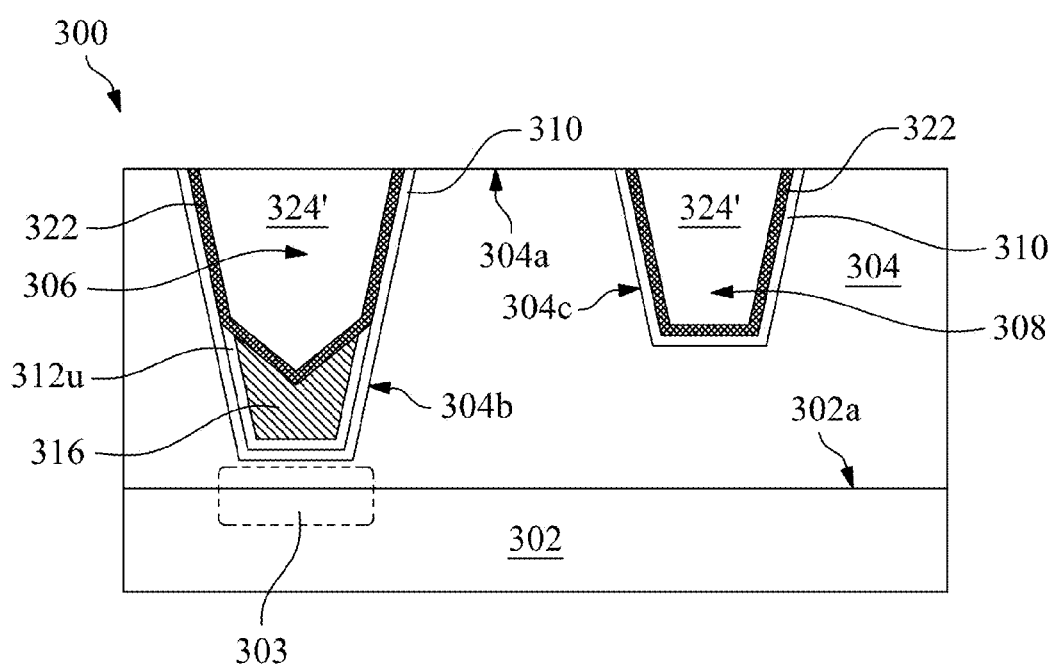

The second conductive material 324 is subsequently planarized to form a planarized second conductive material 324', as shown in FIG. 3H. The planarization may be performed by a chemical mechanical polish (CMP) process which may remove excess portions of the second conductive material 324 disposed outside the first recess 306 and the second recess 308. In addition to removing excess portions of the second conductive material 324, portions of the second seed layer 322 and the barrier layer 310 disposed outside the first recess 306 and the second recess 308 are also removed, as shown in the example of FIG. 3H.

Using the process steps shown in FIG. 3A to FIG. 3H, a conductive structure (e.g. a contact plug, e.g. a source/drain contact plug) may be formed in each of the first recess 306 and the second recess 308. The conductive structure may contact (e.g. electrically contacting) an underlying electrical element (e.g. via, conductive line or trace, etc.) and/or an underlying electronic component (e.g., transistor, diode, resistor, capacitor, etc.) that may be formed in the semiconductor substrate layer 302 and/or the insulating layer 304.

Since the first recess 306 and the second recess 308 have different depths, the conductive structures formed therein have different critical dimensions and depths. Accordingly, the process steps shown in FIG. 3A to FIG. 3H may be used to manufacture conductive structures of varying critical dimensions and depths. Furthermore, an effect provided by the process steps shown in FIG. 3A to FIG. 3H is that gaps, voids, or seam holes are prevented from forming within the conductive structures formed in the first recess 306 and the second recess 308. In a conventional process flow, the second seed layer 322 may be formed over the treated portion of the first seed layer 312t and the second conductive material 324 may subsequently be formed over the second seed layer 322. However, in the process steps shown in FIG. 3A to FIG. 3H, the treated portion of the first seed layer 312t is removed. By removing the treated portion of the first seed layer 312t, the volume that would have been occupied by the treated portion of the first seed layer 312t is now occupied by the second bulk conductive material having lower resistivity. Accordingly, the resistivity of the conductive structures formed in the first recess 306 and the second recess 308 is reduced. Even further, changes in phase of a conductive material from a low resistivity phase to a high resistivity phase are avoided by the removal of the treated portion of the first seed layer 312t, thus preventing any increase in the resistivity of the conductive structures formed in the first recess 306 and the second recess 308.

Figure 4A:
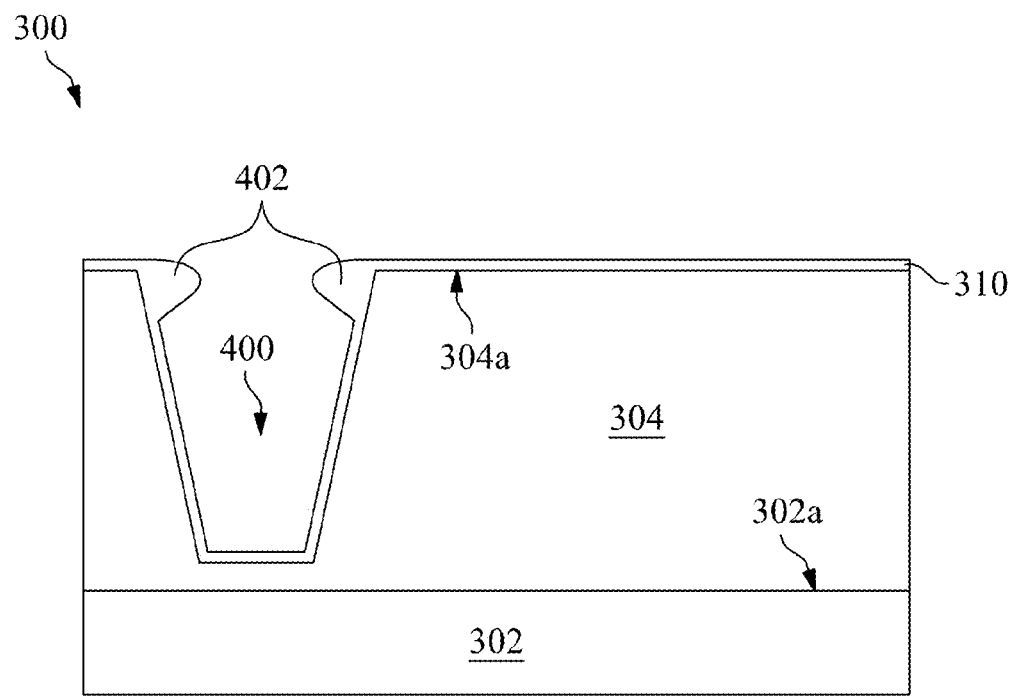
FIG. 4A to FIG. 4H show a process flow illustrating some of the process steps of a method of forming a conductive structure in a recess having an overhang, in accordance with some embodiments.

FIG. 4A to FIG. 4H show a process flow illustrating some of the process steps of the method 100 shown in FIG. 1 and the method 200 shown in FIG. 2, in accordance with one or more embodiments. FIG. 4A shows the substrate 300 including the semiconductor substrate layer 302, the insulating layer 304, the barrier layer 310 and a third recess 400. In comparison to the first recess 306 and the second recess 308, the third recess 400 may have an overhang 402 such that the barrier layer 310 is thicker near the opening of the third recess 400 than inside the third recess 400. Even so, the process steps for forming a conductive structure within the third recess 400 may proceed in a similar manner as described above in respect of FIG. 3A to FIG. 3H.

Figure 4B:
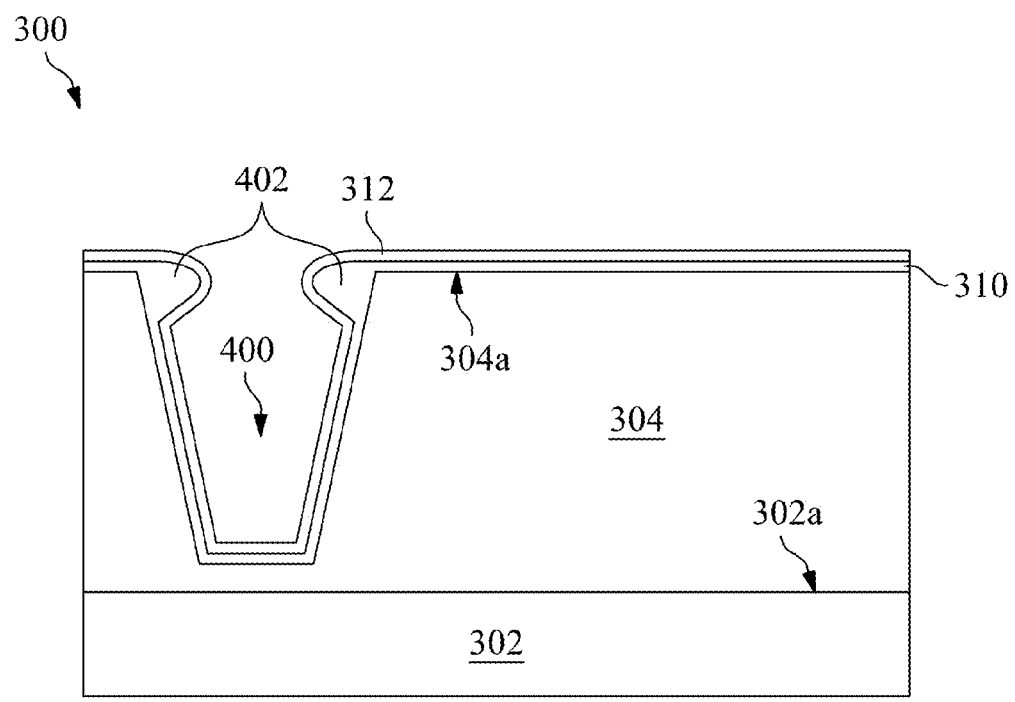
Figure 4C:
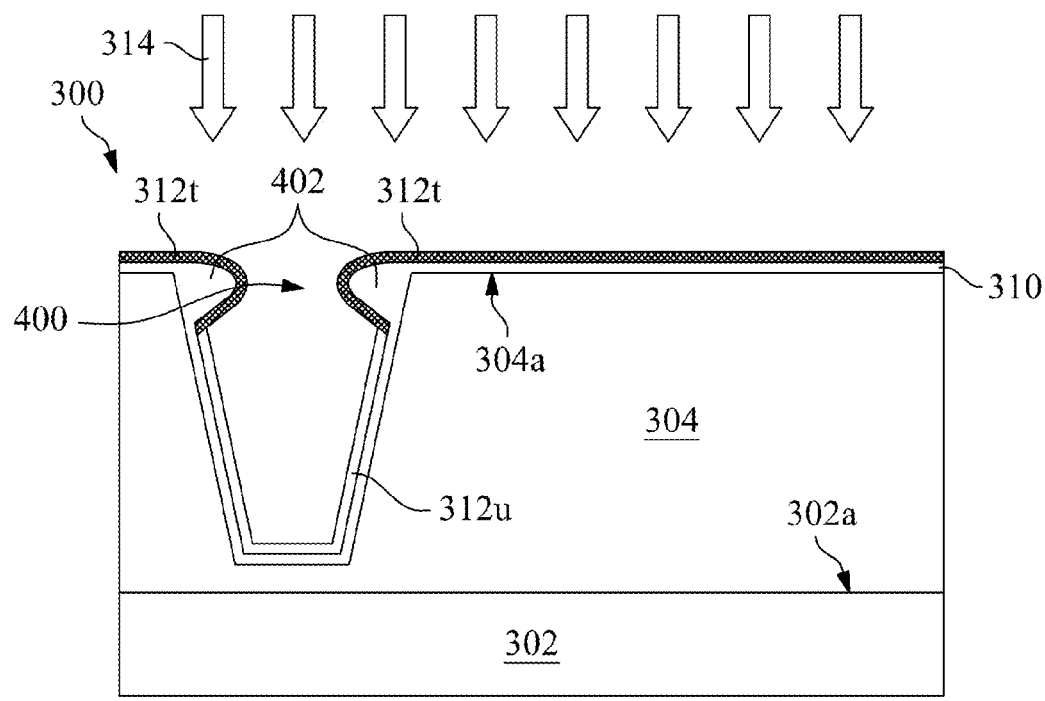

As shown in FIG. 4B, the first seed layer 312 may line the exposed surfaces of the barrier layer 310. As shown in FIG. 4C, portions of the first seed layer 312 may be exposed to the treatment process 314 to form treated portions of the first seed layer 312t. Portions of the first seed layer 312 not exposed to the treatment process 314 may be referred to as untreated portions of the first seed layer 312u. Portions of the first seed layer 312 exposed to the treatment process 314 may include, or may be, portions of the first seed layer 312 disposed over the surface 304a of the insulating layer 304 and portions of the first seed layer 312 disposed over the overhang 402. Portions of the first seed layer 312 on the angled sidewalls of the third recess 400 may be left untreated.

Figure 4D:
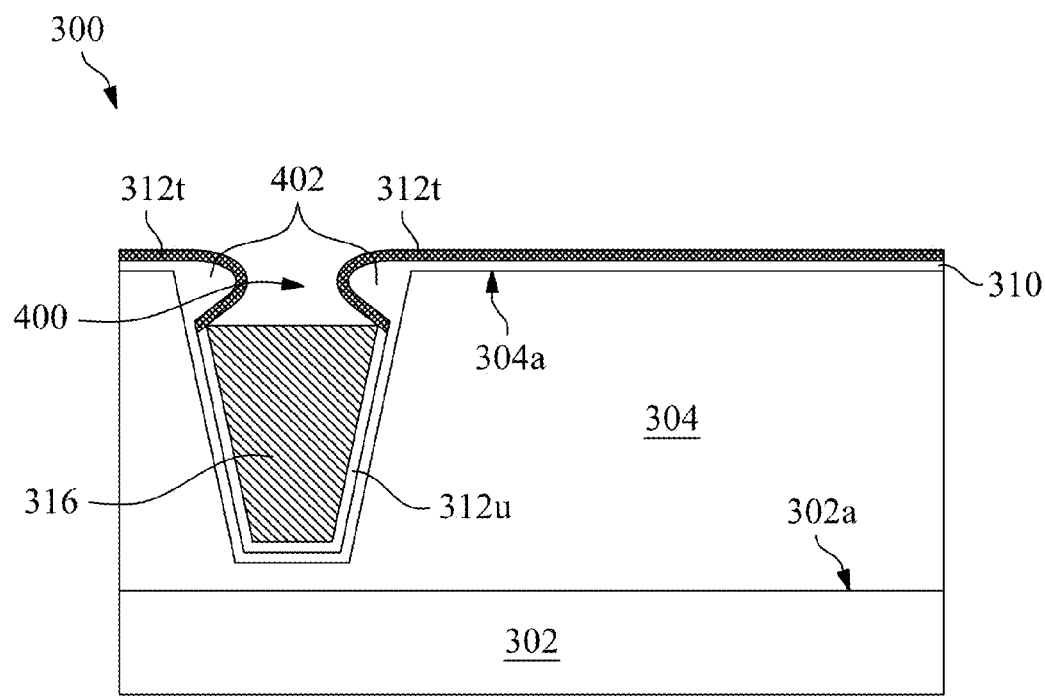

As shown in FIG. 4D, the first conductive material 316 may be formed in the third recess 400 over the untreated portions of the first seed layer 312u. Despite the overhang 402, gaps, voids, or seam holes are prevented from forming in the first conductive material 316 due to the treatment process 314, which allows the filling of the third recess 400 to proceed in a bottom-up manner as described above.

Figure 4E:
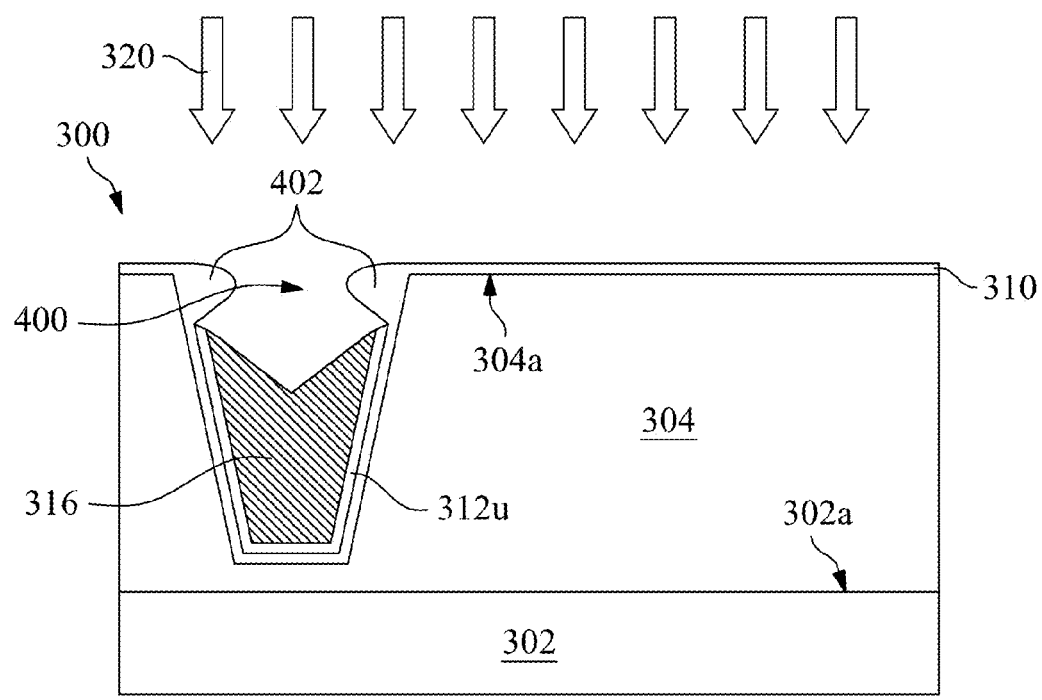
Figure 4F:
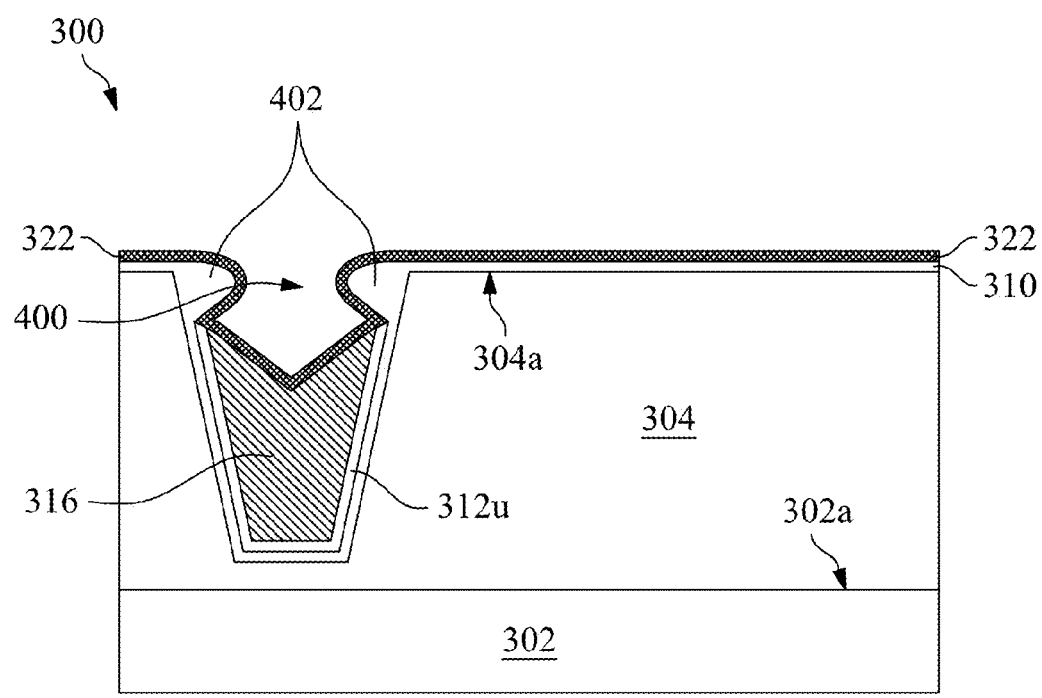

As shown in FIG. 4E, the treated portions of the first seed layer 312t over the surface 304a of the insulating layer 304 may be removed (e.g. by the etch process 320). Portions of the treated portions of the first seed layer 312t at the overhang 402 may likewise be removed. In addition, the etch process 320 may remove portions of the overhang 402, thus enlarging an opening of the third recess 400. This may have an advantageous effect of allowing easier deposition or formation of material within the third recess 400. For example, as shown in FIG. 4F, the second seed layer 322 may be more easily formed in the third recess 400 due to the enlarged opening of the third recess 400. The second seed layer 322 lines the exposed surfaces of the third recess 400, the surface of the first conductive material 316 facing the opening of the third recess 400, the overhang 402, and the barrier layer 310 disposed over the surface 304a of the insulating layer.

Figure 4G:
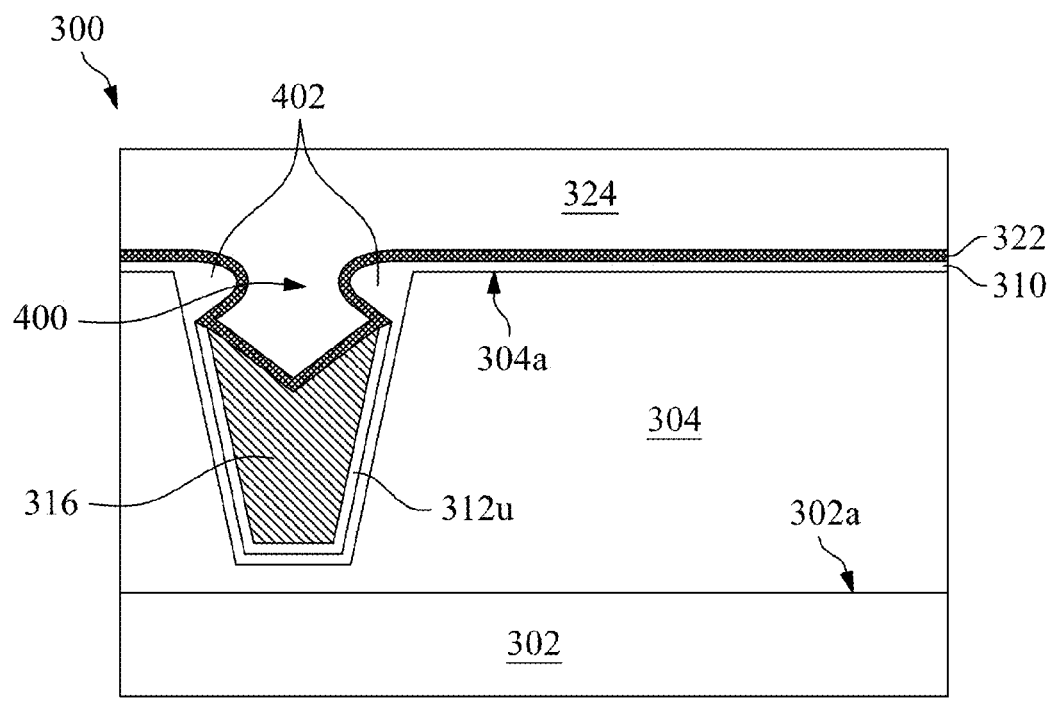

As shown in FIG. 4G, the third recess 400 having the second seed layer 322 formed therein is overfilled will the second conductive material 324. In the example shown in FIG. 4G, the second conductive material 324 covers the first conductive material 316 and the second seed layer 322 within the third recess 400. In addition, the second conductive material 324 covers the second seed layer 322 disposed outside the third recess 400.

Figure 4H:
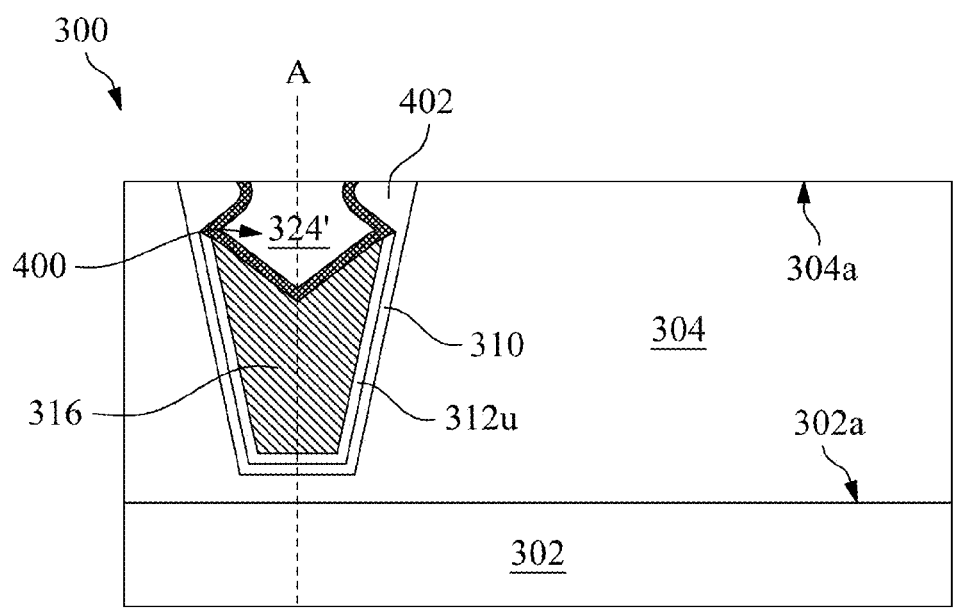

The second conductive material 324 is subsequently planarized to form the planarized second conductive material 324', as shown in FIG. 4H. As described above, the planarization may be performed by a CMP process which may remove excess portions of the second conductive material 324 disposed outside third recess 400 as well as portions of the second seed layer 322 and the barrier layer 310 disposed outside the third recess 400. In doing so, a portion of the overhang 402 may be removed as well, as shown in FIG. 4H.

Using the process steps shown in FIG. 4A to FIG. 4H, a conductive structure (e.g. a contact plug) may be formed in the third recess 400 having the overhang 402. Similar to the process steps shown in FIG. 3A to FIG. 3H, an effect provided by the process steps shown in FIG. 4A to FIG. 4H is that gaps, voids, or seam holes are prevented from forming within the conductive structures formed in the third recess 400. In a conventional process flow, the second seed layer 322 may be formed over the treated portion of the first seed layer 312t and the second conductive material 324 may subsequently be formed over the second seed layer 322. However, in the process steps shown in FIG. 4A to FIG. 4H, the treated portion of the first seed layer 312t is removed. By removing the treated portion of the first seed layer 312t, the volume that would have been occupied by the treated portion of the first seed layer 312t is now occupied by the second bulk conductive material having lower resistivity. Accordingly, the resistivity of the conductive structures formed in the third recess 400 is reduced. Even further, changes in phase of a conductive material from a low resistivity phase to a high resistivity phase are avoided by the removal of the treated portion of the first seed layer 312t, thus preventing any increase in the resistivity of the conductive structures formed in the third recess 400.

Figure 5:
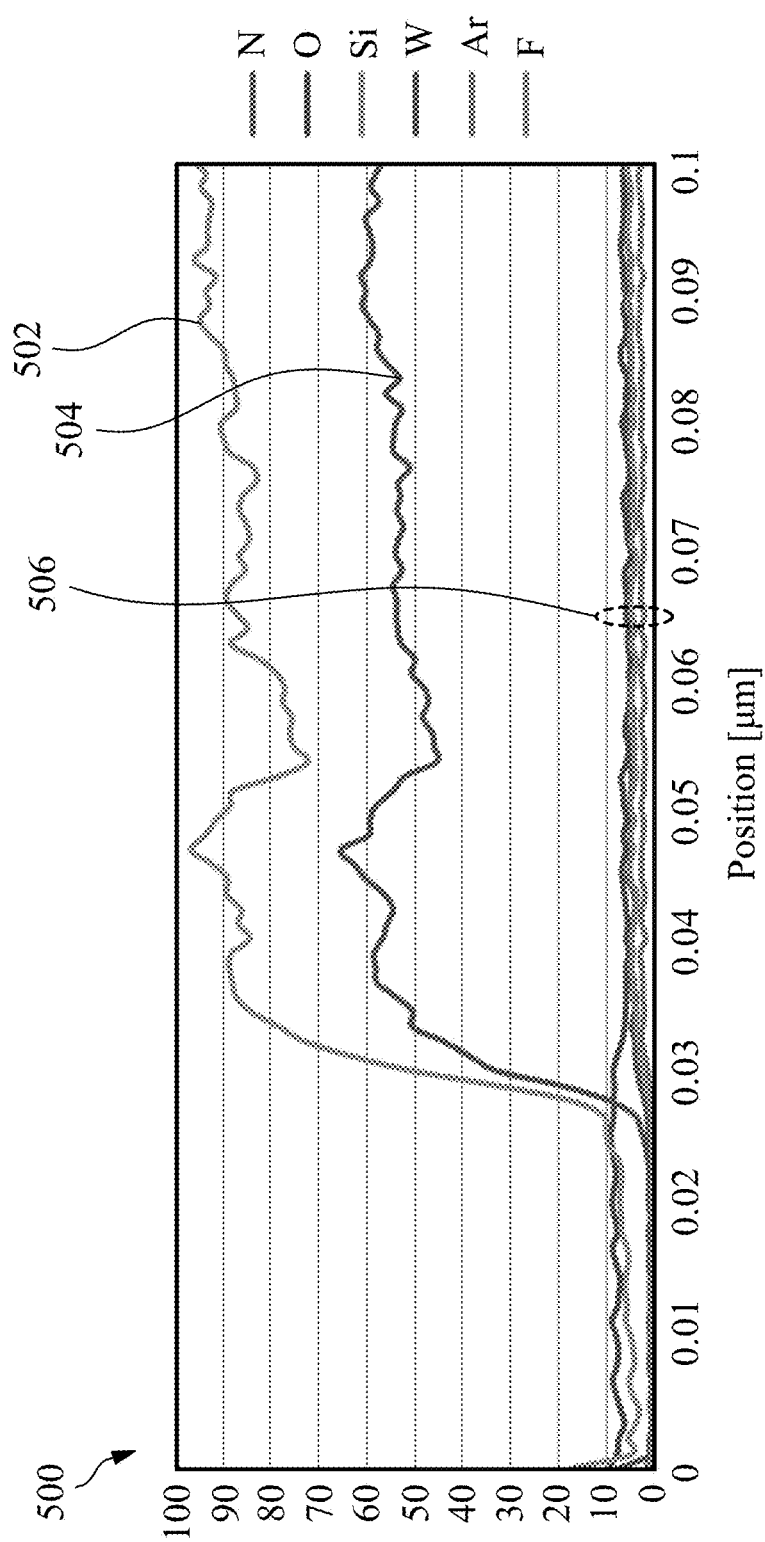
FIG. 5 shows a concentration profile of the conductive structure formed according to the process steps shown in FIG. 4A to FIG. 4H.

FIG. 5 shows a concentration profile 500 taken along the line A-A' shown in FIG. 4H. The concentration profile shows the variation in concentration of various materials as a function of position, with the position 0 micrometers shown in FIG. 5 being at point A and the position 0.1 micrometers shown in FIG. 5 being at point A'.

It may be observed that even with the application of the etch process 320 to remove the treated portions of the first seed layer 312t, there are no excessive amounts of undesirable materials introduced into the conductive structure formed within the third recess 400 that may adversely affect conductivity and/or resistivity of the conductive structures. For example, as shown in FIG. 5, oxygen, argon and fluorine (shown in FIG. 5 as the group of curves 506) are present in the conductive structure formed in the third recess 400 in low concentrations (e.g. less than about 10 units). On the other hand, silicon (shown in FIG. 5 as the curve 502) and tungsten (shown in FIG. 5 as the curve 504) have relatively high concentrations in the third recess 400, as expected.

Figure 6:
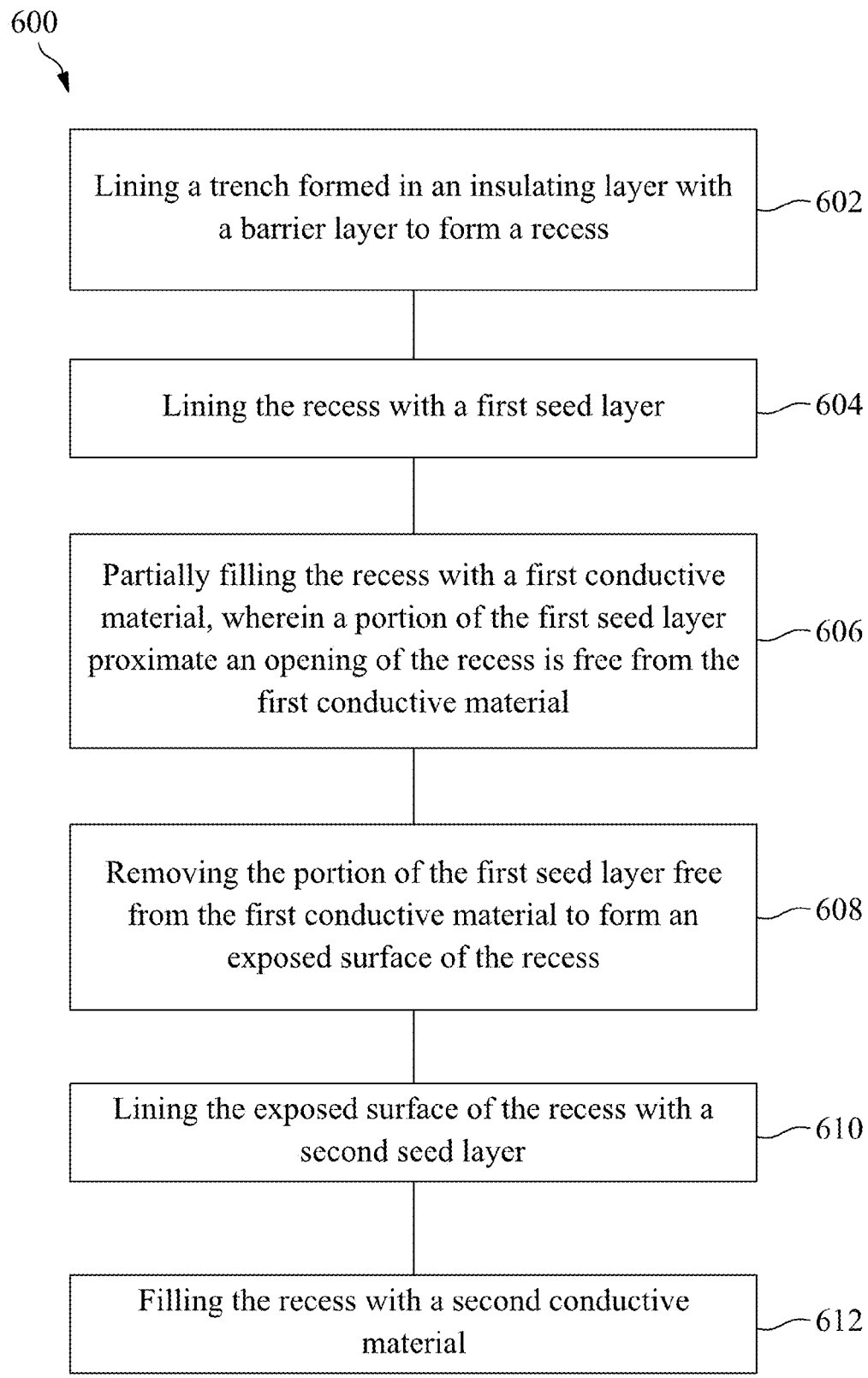
FIG. 6 shows a method of forming a conductive structure, in accordance with some embodiments.

Based on the process flows shown in FIG. 3A to FIG. 3H and FIG. 4A to FIG. 4H, a method 600 of forming a conductive structure may be provided (shown in FIG. 6). As shown in FIG. 6, the method 600 may include: lining a trench formed in an insulating layer with a barrier layer to form a recess (in 602); lining the recess with a first seed layer (in 604); partially filling the recess with a first conductive material, wherein a portion of the first seed layer proximate an opening of the recess is free from the first conductive material (in 606); removing the portion of the first seed layer free from the first conductive material to form an exposed surface of the recess (in 608); lining the exposed surface of the recess with a second seed layer (in 610); and filling the recess with a second conductive material (in 612).

According to various embodiments presented herein, a method of forming a conductive structure may be provided. The method may include: providing a substrate having a recess formed therein, the recess lined with a first seed layer and partially filled with a first conductive material; removing a portion of the first seed layer free from the first conductive material to form an exposed surface of the recess; lining the exposed surface of the recess with a second seed layer; and filling the recess with a second conductive material, the second conductive material covering the first conductive material and the second seed layer.

According to various embodiments presented herein, a method of forming a conductive structure may be provided. The method may include: providing a substrate having a first recess and a second recess formed therein, wherein the first recess extends into the substrate by a first distance and the second recess extends into the substrate by a second distance smaller than the first distance; lining the first recess and the second recess with a first seed layer; exposing the first seed layer in the second recess and a portion of the first seed layer in the first recess proximate an opening of the first recess to a treatment plasma to form treated portions of the first seed layer; partially filling the first recess with a first conductive material, wherein the treated portions of the first seed layer are free from the first conductive material; removing the treated portions of the first seed layer to form exposed surfaces of the first recess and the second recess; lining the exposed surfaces of the first recess and the second recess with a second seed layer; and covering the second seed layer with a second conductive material, the second conductive material filling the first recess and the second recess.

According to various embodiments presented herein, a method of forming a conductive structure may be provided. The method may include: lining a trench formed in an insulating layer with a barrier layer to form a recess; lining the recess with a first seed layer; partially filling the recess with a first conductive material, wherein a portion of the first seed layer proximate an opening of the recess is free from the first conductive material; removing the portion of the first seed layer free from the first conductive material to form an exposed surface of the recess; lining the exposed surface of the recess with a second seed layer; and filling the recess with a second conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a substrate having a recess formed therein, the recess lined with a first seed layer and partially filled with a first conductive material;
removing a portion of the first seed layer free from the first conductive material to form an exposed surface of the recess, the exposed surface of the recess including a barrier layer, the barrier layer remaining intact within the recess above the first conductive material, wherein removing the portion of the first seed layer comprises removing a portion of the first conductive material to form a depression in a surface of the first conductive material;
lining the exposed surface of the recess with a second seed layer; and
filling the recess with a second conductive material, the second conductive material covering the first conductive material and the second seed layer.

2. The method of claim 1, wherein the removing the portion of the first seed layer free from the first conductive material comprises etching the portion of the first seed layer free from the first conductive material.

3. The method of claim 2, wherein the etching the portion of the first seed layer free from the first conductive material comprises plasma etching the portion of the first seed layer free from the first conductive material with a plasma etchant.

4. The method of claim 3, wherein the plasma etchant comprises a halogen containing plasma etchant.

5. The method of claim 4, wherein the halogen containing plasma etchant comprises a fluorine containing plasma etchant.

6. The method of claim 1, wherein the removing the portion of the first seed layer free from the first conductive material comprises etching the portion of the first seed layer free from the first conductive material and a surface of the first conductive material facing an opening of the recess.

7. The method of claim 1, wherein the lining the exposed surface of the recess with the second seed layer comprises a process selected from a group consisting of a pulsed nucleation layer process, an atomic layer deposition process, and combinations thereof.

8. A method, comprising:
lining a trench formed in an insulating layer with a barrier layer to form a recess;
lining the recess with a first seed layer;
partially filling the recess with a first conductive material, wherein a portion of the first seed layer proximate an opening of the recess is free from the first conductive material;
removing the portion of the first seed layer free from the first conductive material to form an exposed surface of the recess, the barrier layer remaining intact within the trench above the first conductive material;
lining the exposed surface of the recess with a second seed layer; and
filling the recess with a second conductive material.

9. The method of claim 8, wherein the partially filling the recess with the first conductive material comprises:
treating the portion of the first seed layer proximate the opening of the recess to form a treated portion of the first seed layer; and
filling the recess with the first conductive material, wherein the treated portion of the first seed layer is free from the first conductive material.

10. The method of claim 9, wherein the treating the portion of the first seed layer comprises exposing the portion of the first seed layer to a treatment plasma.

11. The method of claim 10, wherein the treatment plasma comprises a plasma selected from a group consisting of a nitrogen containing plasma, a hydrogen containing plasma, an oxygen containing plasma, a hydrocarbon containing plasma, and combinations thereof.

12. The method of claim 8, wherein the partially filling the recess with the first conductive material comprises growing a thickness of the first conductive material from a floor of the recess towards the opening of the recess.

13. The method of claim 8, wherein the lining the exposed surface of the recess with the second seed layer comprises forming the second seed layer over the exposed surface of the recess and over a surface of the first conductive material facing the opening of the recess.

14. The method of claim 8, wherein the lining the recess with the first seed layer comprises forming the first seed layer having a thickness in a range from about 1 nanometer to about 5 nanometers.

15. The method of claim 8, wherein the lining the exposed surface of the recess with the second seed layer comprises forming the second seed layer having a thickness in a range from about 1 nanometer to about 8 nanometers.

16. A method, comprising:
providing a substrate having a first recess and a second recess formed therein, wherein the first recess extends into the substrate by a first distance and the second recess extends into the substrate by a second distance smaller than the first distance;
lining the first recess and the second recess with a first seed layer;
exposing the first seed layer in the second recess and a portion of the first seed layer in the first recess proximate an opening of the first recess to a treatment process to form treated portions of the first seed layer;
partially filling the first recess with a first conductive material without filling any of the second recess with the first conductive material, wherein the treated portions of the first seed layer are free from the first conductive material;
removing the treated portions of the first seed layer to form exposed surfaces of the first recess and the second recess;
lining the exposed surfaces of the first recess and the second recess with a second seed layer via a pulsed nucleation layer (PNL) process; and
covering the second seed layer with a second conductive material, the second conductive material filling the first recess and the second recess.

17. The method of claim 16, wherein the exposing the first seed layer in the second recess and the portion of the first seed layer in the first recess proximate the opening of the first recess to the treatment process comprises treating the first seed layer in the second recess and the portion of the first seed layer in the first recess proximate the opening of the first recess with a treatment plasma.

18. The method of claim 17, wherein the treatment plasma comprises a plasma selected from a group consisting of a nitrogen containing plasma, a hydrogen containing plasma, an oxygen containing plasma, a hydrocarbon containing plasma, and combinations thereof.

19. The method of claim 16, wherein the removing the treated portions of the first seed layer to form exposed surfaces of the first recess and the second recess comprises exposing the treated portions of the first seed layer to an etching process.

20. The method of claim 19, wherein the etching process comprises a plasma etching process.

* * * * *